United States Patent [19]

So

[11] Patent Number: 4,833,401
[45] Date of Patent: May 23, 1989

[54] ELECTRICAL MEASURING INSTRUMENT FOR HIGH VOLTAGE POWER MEASUREMENTS

[75] Inventor: Eddy So, Gloucester, Canada

[73] Assignee: Canadian Patents & Development Ltd., Ottawa, Canada

[21] Appl. No.: 131,915

[22] Filed: Dec. 11, 1987

[51] Int. Cl.$^4$ .............................. G01R 7/00
[52] U.S. Cl. .................... 324/142; 324/86; 324/107; 324/127
[58] Field of Search ............... 324/86, 83 R, 83 A, 324/83 D, 107, 103 R, 140 R, 127, 141, 142

[56] References Cited

U.S. PATENT DOCUMENTS

| | | | |
|---|---|---|---|
| 4,121,150 | 10/1978 | Kelley, Jr. | 324/107 |
| 4,272,723 | 6/1981 | Pullen | 324/86 |
| 4,300,182 | 11/1981 | Schweitzer, III | 324/141 |
| 4,303,881 | 12/1981 | Czerwien | 324/142 |
| 4,321,529 | 3/1982 | Simmonds et al. | 324/127 |
| 4,459,546 | 7/1984 | Arrington | 324/142 |
| 4,556,843 | 12/1985 | Milkovic | 324/142 |
| 4,703,387 | 10/1987 | Miller | 324/103 R |
| 4,713,608 | 12/1987 | Catiller | 324/140 R |
| 4,749,941 | 6/1988 | Halder | 324/142 |

Primary Examiner—Michael J. Tokar
Attorney, Agent, or Firm—Yoshiharu Toyooka

[57] ABSTRACT

A current-comparator technique for obtaining an instrument for accurate high voltage power measurements at very low power factors is described. The quadrature component of the load current is automatically balanced in the current comparator against a quadrature current obtained from a slave supply, thereby reducing the stringent high accuracy requirement of the instrument when used for measuring power at a very low power factors. The current-comparator-based instrument according to the present invention has an estimated accuracy with respect to its readings of better than 3 percent at 0.001 power factor, 1 percent at 0.005 power factor and 0.5 percent at 0.01 power factor and higher. It features an internal high-voltage active-divider and displays to indicate source voltage, current, power factor and reactance of the load, in addition to the power.

19 Claims, 2 Drawing Sheets

ELECTRICAL MEASURING INSTRUMENT FOR HIGH VOLTAGE POWER MEASUREMENTS

FIELD OF INVENTION

This invention relates to electrical measuring instruments for performing high voltage power measurements. In particular, the invention is directed to current-comparator-based measuring instruments which perform such measurements on high voltage loads at very low power factors.

BACKGROUND OF INVENTION

Large power transformers and high voltage shunt reactors are characterized by their load losses remaining nearly constant with increasing size. For example, a 100-MVA power transformer might have a power factor of 2 percent while another with a 250 MVA rating would have a power factor of 1 percent. Corresponding power factors for high voltage shunt reactors are typically 0.4 percent at 50 MVA and 0.2 percent at 100 MVA. Accurate loss measurements at such low power factors are difficult because of the presence of the large quadrature component of current. For power measurement that is accurate to 1 percent of 0.002 power factor, a technique with an overall accuracy of (0.002×1) or 0.002 percent is required. This is equivalent to a total phase error of not more than 20 $\mu$rad anywhere in the measurement system, usually in the voltage and current transducers, or if there are no phase errors, an accuracy of 20 ppm (parts per million) of full scale in the wattmeter. Although highly accurate standard wattmeters (G. N. Stenbakken, "A wide band sampling wattmeter", IEEE Trans. Power App. Syst., Vol. PAS-103, No. 10, pp. 2919–2926, October 1984), active voltage dividers (E. So, "The application of the current comparator in instrumentation for high voltage power measurements at very low power factors", IEEE Trans. Power Delivery, Vol. PWDRD-1, No. 1, pp. 98–104, January 1986), and current transformers (W. J. M. Moore, G. Love and F. A. Raftis, "Measurement of short circuit load losses in large three phase power transformers using an alternating current comparator bridge", IEEE Trans. Power App. Syst., Vol. PAS-94, No. 6, pp. 2074–2076, November/December 1975) have been developed, the stringent high accuracy requirements of the instruments can be greatly reduced by removing the large quadrature component of the load current so that the wattmeter would be operating at/or near unity power factor. At unity power factor, accurate knowledge of the voltage and current magnitude is essential but considerable latitude in the phase angle between these two quantities is permissible. For a power measurement that is accurate to 1 percent of unity power factor, a total phase error of up to 0.14 radians or 487 minutes can be tolerated, or if there are no phase errors, a wattmeter with an accuracy of 1 percent is sufficient.

This technique of measuring the loss component of the load current by removing its quadrature component has basically been implemented in the bridge technique for measuring load losses. Such measurements using a current-comparator-based capacitance bridge have been described (see the above-referenced article by Moore et al). The quadrature component of the load current is balanced in the current comparator against the quadrature current obtained from a low-loss high-voltage compressed-gas-dielectric capacitor. The loss component is then balanced by the loss tangent (tan $\delta$) balancing circuit, which does not require great accuracy. Its accuracy is only in the order of 0.5 to 1 percent of the tan $\delta$ reading.

A semi-automatic bridge has been described (R. Malewski, W. E. Anderson and W. J. M. Moore, "Interlaboratory comparison of EHV shunt reactor loss measurements", IEEE Trans. Power App. Syst., Vol. PAS-99, No. 4, pp. 1634–1641, July/August 1980) in which the quadrature component of the inductive load current is manually balanced, approximately, in the current comparator against the current from the reference capacitor so that only a small residual unbalance current remains. The load loss component of this residual current is extracted by multiplying a voltage proportional to the residual current by a replica of the source voltage. The multiplier output is then proportional to the power loss of the inductive load.

OBJECTS OF INVENTION

It is an object of the present invention to provide an electrical measuring instrument for performing high voltage power measurements of a load at very low power factors.

It is another object of the present invention to provide an electrical measuring instrument which includes a current comparator.

It is still another object of the present invention to provide an electrical measuring instrument which can measure the power loss of an inductive or capacitive load at very low power factors in addition to other measurements, such as load current, load voltage, reactance and quadrature balance.

SUMMARY OF INVENTION

Briefly stated, according to the present invention, the electrical measuring instrument for performing high power measurements at very low power factors of a load connected to a high voltage source has current comparator means having at least three windings, first ratio, second ratio and detection windings. The instrument further includes load current means to be connected in series to the load and the high voltage source for generating a load current signal indicative of the electrical load current flowing through the load and reference quadrature current means to be connected directly to the high voltage source for generating a reference quadrature current signal indicative of the quadrature component of a reference load current flowing therethrough. Slave supply means is connected to the load current means and the reference quadrature current means for generating a quadrature current signal in response to the load current signal and the reference quadrature current signal. The first ratio winding of the current comparator means is to be connected in series with the load and the second ratio winding to the slave supply means. The slave supply means is designed to produce the quadrature current signal to balance the quadrature component of the load current in the current comparator means. The instrument further includes detector means connected to the detection winding of the current comparator means for detecting ampere-turn unbalance therein and multiplier means is connected to the detector means for generating a display signal indicative of one of high voltage power measurements. Quadrature ampere-turn balance means is also connected to the detector means for generating and applying a feedback signal to the slave supply means.

BRIEF DESCRIPTION OF DRAWINGS

The foregoing and other objects and features of the invention may be readily understood with reference to the following detailed description taken in conjunction with the accompanying drawings, in which.

DETAILED DESCRIPTION OF PREFERRED EMBODIMENTS

Briefly stating the operating principle, in the current-comparator-based measuring instruments according to the present invention, the quadrature component of the load current is automatically balanced in the current comparator against a quadrature current obtained from a slave supply, which is controlled by a signal proportional to the load current and also that from a quadrature ampere-turn balance means. The remaining unbalance current is then due to the loss component of the load current. Since the multiplier (or wattmeter) operate at/or near unity power factor, its accuracy and that of the high-voltage active-divider need not be high. The current-comparator-based wattmeter has an estimated accuracy with respect to its readings of better than 3 percent at 0.001 power factor, 1 percent at 0.005 power factor, and 0.5 percent at 0.01 power factor and higher. It features an internal high-voltage active-divider and displays to indicate source voltage, current, power factor, and reactance of the load, in addition to the power.

Figure 1:
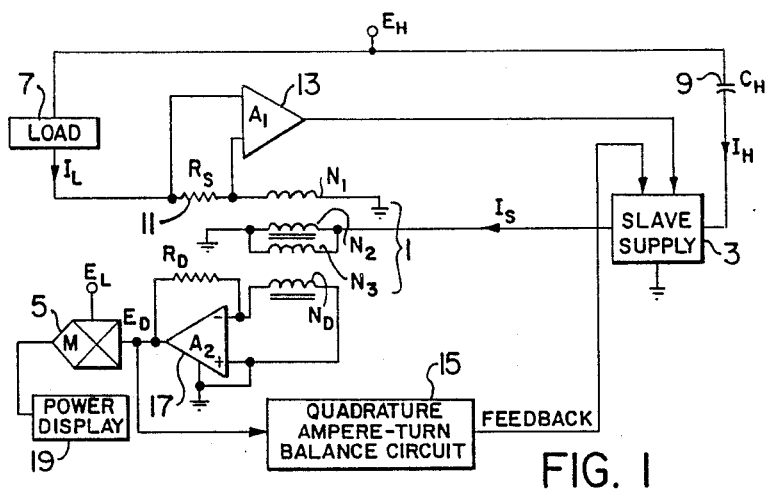
FIG. 1 is a schematic diagram of the basic circuit of the wattmeter according to the present invention.

The basic circuit of the current-comparator-based wattmeter is shown in FIG. 1. It consists of three main parts: (A) a current comparator 1 having a plurality of windings e.g. $N_1$, $N_2$, $N_3$ and $N_D$ which provides the means for removing the quadrature component of the load current by balancing it against a quadrature current signal obtained from a slave supply 3, (B) the slave supply 3 which automatically tracks the ampere-turns in the current comparator 1 due to the quadrature component of the load current to keep the net quadrature ampere-turn unbalance at zero and (C) a multiplier 5 which provides a product proportional to the power loss in a load 7. The plurality of windings, $N_1$, $N_2$, $N_3$ and $N_D$ are called the first ratio, the second ratio, the compensating and the detection windings, respectively. Automatic balance of the ampere-turns of winding $N_1$ due to the quadrature component of the load current $I_L$ is achieved by means of an open-loop control which gives coarse balance and closed-top control which gives fine balance. The open-loop control is provided by the slave supply 3 which is in effect an ampere-turn tracking circuit and is supplied with the quadrature component $I_H$ of a reference load current, driven by the source voltage $E_H$ through a low-loss high-voltage compressed-gas-dielectric reference capacitor 9. The gain is controlled by a signal proportional to the load current obtained via a shunt resistor 11 and differential amplifier 13. the gain control is such that the output current $I_S$ of the slave supply 3 is proportional to the quadrature component of the load current $I_L$. Thus the slave supply causes a current in the $N_2$ and $N_3$ windings to keep the net quadrature ampere-turns approximately zero. The closed-loop control from the detection winding $N_D$ and quadrature ampere-turn balance circuit 15 tends to keep the net quadrature ampere-turn unbalance at zero by feeding back its signal to the slave supply 3.

The remaining ampere-turn unbalance due to the in-phase or loss component of the load current is detected by the winding $N_D$ which is connected to the current-to-voltage converter 17. The output $E_D$ of the converter is multiplied by the multiplier 5 with a reduced replica $E_L$ of the source voltage $E_H$. The multiplier 5 produces a DC voltage output which is proportional to the power loss of the load and displayed by a power display 19. The multiplier 5 therefore acts as a wattmeter operating at/or near unity power factor. Thus the phase accuracy of the voltage divider providing the reduced replica $E_L$ of the source voltage $E_H$ is no longer critical. As mentioned above for a 1 percent accuracy of the power loss measurement, a total phase error of up to 0.14 radians or 487 minutes can be tolerated.

Figure 2:
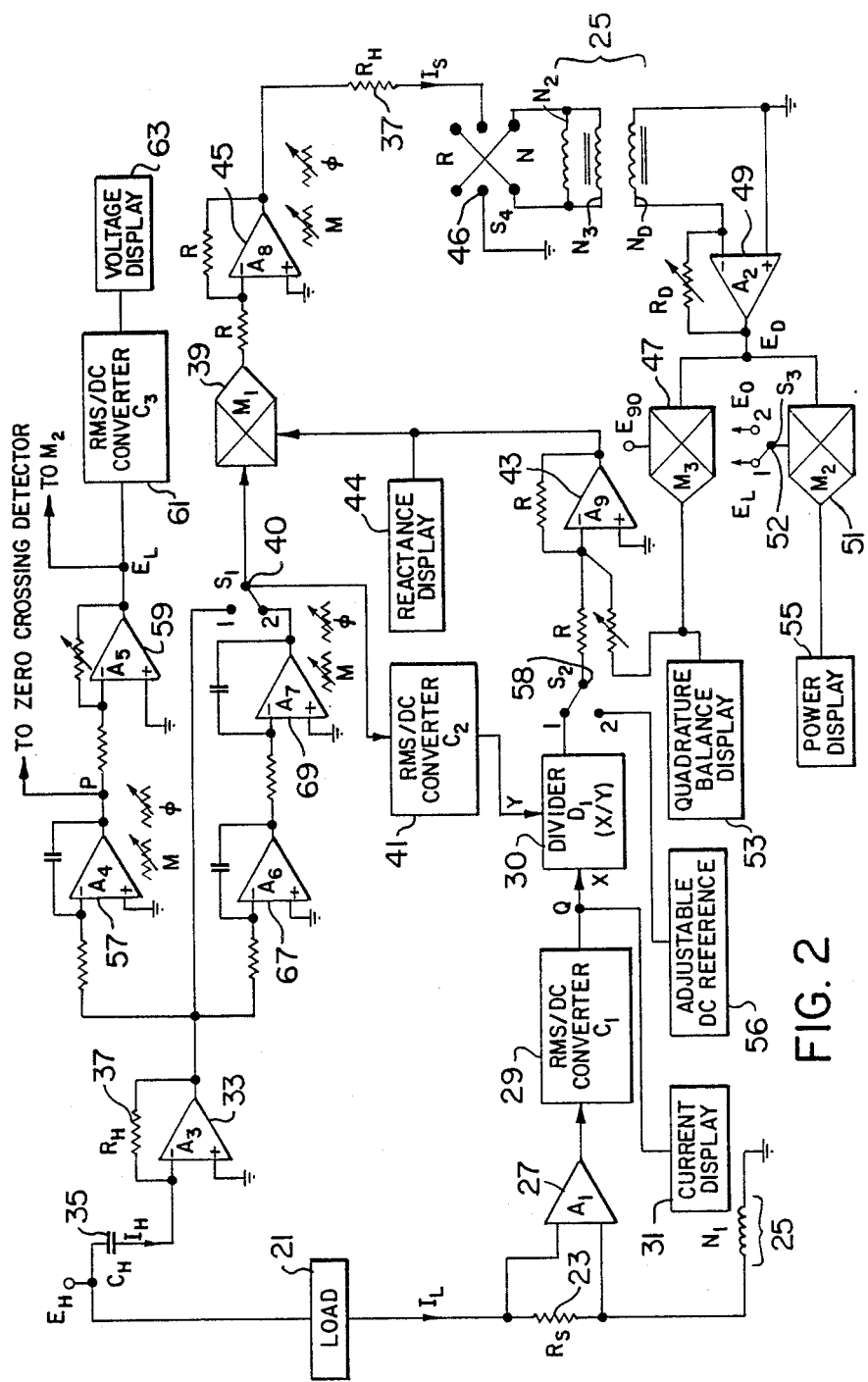
FIG. 2 is a schematic diagram of the measuring instrument according to one preferred embodiment of the present invention.

FIG. 2 shows a preferred embodiment of the present invention which embodies not only the basic circuit of the wattmeter shown in FIG. 1 but also various other associated circuits which facilitate other measurements of the load. As in FIG. 1, a load 21 under test is connected in series with a shunt resistor 23 and the $N_1$ winding of a current comparator 25 to the source voltage $E_H$. A differential amplifier 27 and an RMS/DC converter 29 produce a load current signal proportional to the load current $I_L$ which is applied to an analog divider 30. The load current is also displayed by a current display 31.

An amplifier 33 is connected to a low-loss high-voltage compressed-gas-dielectric reference capacitor 35 which is in turn connected to the source voltage $E_H$ to allow a reference load current to flow therethrough. With a resistor 37 the amplifier 33 converts the quadrature component $I_H$ of the reference load current to a voltage proportional thereto and applies it to a multiplier 39 via a switch 40. The multiplier 39 forms a part of a slave supply and is used as a voltage-controlled amplifier to set the quadrature current signal $I_S$ proportional to the quadrature component $I_H$ of the reference load current in order to provide tracking of the quadrature ampere-turn of winding $N_1$. An RMS/DC converter 41 converts the output voltage of the amplifier 33 and feeds it to an analog divider 30 which produces a ratio signal indicative of the ratio of the load current $I_L$ and the quadrature component $I_H$ of the reference load current. The ratio signal is converted by a converter 43 to a ratio voltage signal and is applied to the multiplier 39 to control its gain. The output of the multiplier 39 is converted to the qudrature current signal $I_S$ by a converter 45 and is sent to the windings $N_2$ and $N_3$ of the current comparator 25 through a polarity switch 46. Since for low power factors (less than 0.1) the difference in magnitude between the load current $I_L$ and its quadrature component is small (approximately equal to the square of the power factor divided by two), the quadrature current signal $I_S$ of the slave supply therefore is proportional to the quadrature component of the load current $I_L$.

As in FIG. 1, a current-to-voltage converter 49 is connected to the detection winding $N_D$ of the current comparator 25 and sends its output to the multipliers 47 and 51. The multiplier 47 with a fixed magnitude quadrature voltage $E_{90}$ as reference forms a quadrature ampere-turn balance circuit to produce a feedback signal to the converter 43 of the slave supply for the closed-loop control. The feedback signal is used also for a quadrature balance display 53. The multiplier 51 is provided with a switch 52 to select either the in-phase voltage $E_0$ or reduced replica $E_L$ of the source voltage $E_H$ as referenced to produce the output proportional to the in-phase ampere-turn unbalance in the current comparator or the output proportional to the power loss in the load respectively which is displayed by a power display 55. The reduced replica $E_L$ is produced in a reduced replica circuit by an active voltage divider which is made up of a unity gain integrator 57 and an amplifier 59. The output of the amplifier 33, proportional to the quadrature component $I_H$ of the reference load current, is integrated by the integrator 57 and further amplified by the amplifier 59 to produce the reduced replica $E_L$. An RMS/DC converter 61 also is connected to the amplifier 59 for a voltage display 63.

Figure 3:
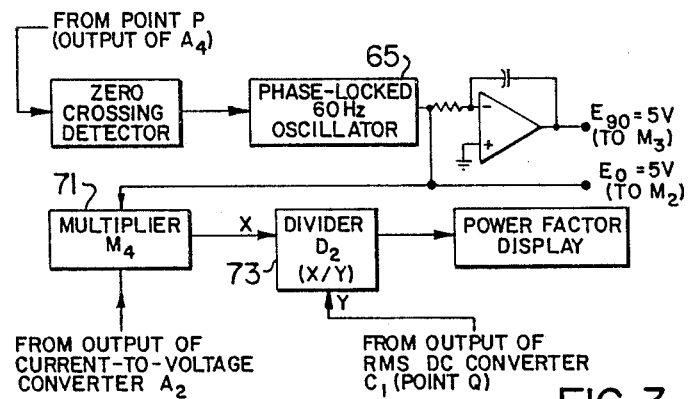
FIG. 3 is a schematic block diagram of a part of an active voltage divider and converter circuit.

FIG. 3 is a schematic block diagram of a part of the reduced replica circuit containing a phase-locked 60 Hz oscillator 65 to generate the quadrature voltage $E_{90}$ and the in-phase voltage $E_0$ of the source voltage. The figure also includes other circuit elements e.g. multiplier 71 and divider 73 for load power factor display.

For an inductive load, although the quadrature component of the load current $I_L$ can be balanced in the current comparator 25 against a capacitive current $I_H$ (quadrature component of reference load current) derived from the reference capacitor 35, harmonics in the source voltage waveform could cause a harmonic ampere-turn unbalance large enough to saturate the current-to-voltage converter 49 and/or the output multiplier 47 and 51, resulting in an erroneous reading of the load loss. An overload indicator (not shown in FIG. 2) is connected to the output of the converter 49 to detect this condition. To overcome this condition the slave supply has two modes of operation depending on the position of switch 40. With the switch 40 in position 2, because of two integrators 67 and 69, the quadrature current signal $I_S$ is an inductive current and the harmonic unbalance does not arise. In this mode, the phase accuracy and linearity of $I_S$ may be expected to be somewhat degraded due to the double integration of the capacitive current $I_H$. However, no degradation in phase accuracy of $I_S$ was observed during calibration and performance checking. For a capacitive load the switch 40 is set in position 1 and the quadrature current signal $I_S$ is a capacitive current.

In the preferred embodiment, the magnetic cores of the current comparator are arranged such that one is inside the other in a toroidal shielding arrangement. The ratio winding $N_1$ and $N_2$ have 100 turns and 1000 turns respectively. Winding $N_1$ is subdivided to provide ratios of 10/20/50/100/200/500 and 1000 to one. The ratio errors of the current comparator are less than ±10 ppm in both magnitude and phase. Higher ratios of up to 1,000,000 to one can be accomodated by using a two-stage current transformer (see the above-referenced article by Moore et al) as a ratio extender (not shown in the figures). The compensation winding $N_3$ also has 1000 turns and is connected in parallel with winding $N_2$ in order to reduce its leakage impedance. A 100-turn detection winding $N_D$ is connected to a current-to-voltage converter 49 to obtain a voltage proportional to and in phase with the unbalanced ampere-turns in the current comparator. The current comparator is current limited at 10 mA in the winding $N_2$ by the available output of the slave supply. This limit was made to coincide with the voltage ratings of the available high-voltage compressed-gas-dielectric capacitors, which are 50 pF, 500 kV; 100 pF, 250 kV. Thus the rating of the current comparator is 10 At.

The output of the current-to-voltage converter 49 is given by:

$$E_D = I_L \cdot \cos\theta \cdot \frac{N_1}{N_D} \cdot R_D \quad (1)$$

$$E_D = I_L \cdot \cos\theta \cdot \frac{N_2}{N_D} \cdot R_D \quad (2)$$

where $\cos\theta$ is the power factor of the load and $N_C$ is the current comparator winding ratio $N_2/N_1$. $R_D$ is a variable resistor 71 with resistance values of 50 k$\Omega$ and 5 k$\Omega$ and 0.5 k$\Omega$, providing a maximum output voltage $E_D$ of 5 V at power factors of 0.001, 0.01 and 0.1, respectively with the current comparator operating at rated ampere-turns (10 At). The maximum output voltage of 5 V has been chosen so as not to saturate the multiplier connected to the output of the converter. The current-comparator-based wattmeter, therefore, can be used for high voltage power measurements at power factors of 0.1 and less, at rated ampere-turns of the current comparator.

For correct tracking of the quadrature ampere-turns of winding $N_1$, the following relationship must be satisfied:

$$G_L \times \frac{N_2}{N_1} = \frac{R_H}{R_S} \quad (3)$$

where $G_L$ is the gain of the differential amplifier 27, $R_S$ is the resistance of the shunt resistor 23 to obtain a signal proportional to $I_L$ and $R_H$ is the resistance of the feedback resistor 37 of the converter 33 and also that of the output resistor of the slave supply. For $R_H$ and $R_S$ constant, an increase in the current comparator winding ratio $N_2/N_1$ requires a corresponding decrease in $G_L$. The switches changing the winding ratio and the gain of the differential amplifier 27 are mechanically coupled to keep $G_L \cdot N_2/N_1$ constant. For RH equals to 500 $\Omega$ and $R_S$ equals to 0.125 $\Omega$, the gain settings $G_L$ are 400/200/80/40/20/8/4 corresponding to winding ratios of 10/20/50/100/200/500/1000 to one. Thus the slave supply provides the open loop control to keep the net quadrature ampere-turns approximately zero. With proper trimmings (gain and offset) of the RMS/DC converters 29 and 41 and divider 30, the balance can be made to be within 0.2 percent. The gain requirement of the closed-loop control from the detection winding $N_D$ and the quadrature ampere-turn balance circuit (multiplier 47) therefore is minimal. A gain of about 5 is quite sufficient to allow multiplier 51 to operate at/or near unity power factor for load power factors as low as 0.1 percent. For load power factors greater than 1 percent, the open loop control is sufficient to provide an accuracy of better than 1 percent of the loss measurement.

The unity gain integrator 57 and the amplifier 59 with gain settings of 1, 2, 5 and 10 form an active voltage divider to produce a reduced replica $E_L$ of the source voltage $E_H$. These gain settings, accurate to 0.1 percent, allow multiplier 51 to operate at maximum sensitivity under most measurement conditions. The combination of converter 33 with feedback resistor $R_H$ of 500 Ω and the unity gain integrator 57 is equivalent to an amplifier having a feedback capacitor $C_V$ with a reactance of 500 Ω. At 60 Hz, $C_V$ is then effectively 5.305 μF. The output $E_L$ of the amplifier 59 can therefore be expressed as $$E_L = \frac{C_H}{C_V} \cdot E_H \cdot G_V \tag{4}$$

where $C_V$ is the effective capacitance (5.305 μF) of the equivalent feedback capacitor and $G_V$ is the gain setting of the amplifier 59. With $I_H = 10$ mA and $G_V = 1$, $E_L$ is 5 V. As with $E_D$, this 5 V output has been chosen so as not to saturate multiplier 51. $E_L$ is displayed with an accuracy of better than 0.2 percent of reading.

The gain of the voltage-controlled amplifier 39 varies between 0 and 1, corresponding to a DC control range of 0 to 10 V. Since the control voltage is proportional to the ratio of the load current $I_L$ and the quadrature component $I_H$ of the reference load current, it is also proportional to the ratio of the reactances of the reference capacitor 35 and the load. The reactance display 44 at the control input of the voltage-controlled amplifier 39, therefore, is a measure of the load reactance. To indicate ratios, the display is made to read 0 to 1 V instead of 0 to 10 V.

From equations (2) and (4), the DC output P of multplier 51, proportional to power loss in the load, is given by:

$$P = \frac{P_L}{N_C} \cdot \frac{N_2}{N_D} \cdot \frac{C_H}{C_V} \cdot R_D \cdot G_V \tag{5}$$

where $P_L$ is the power loss in the load.

Figure 4:
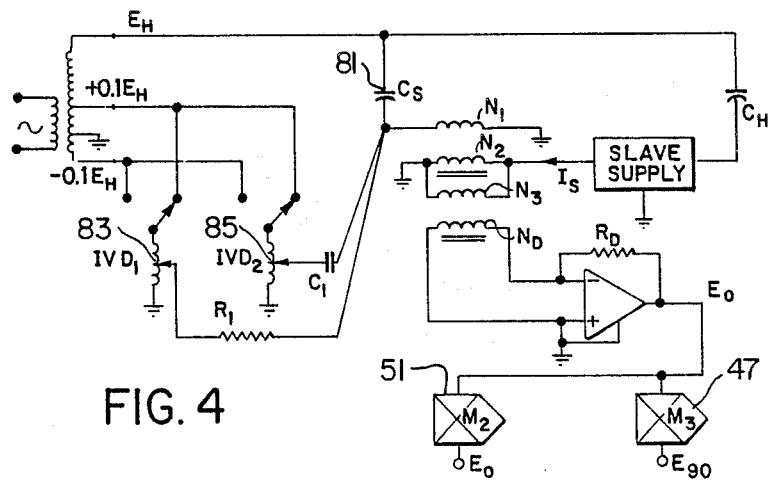
FIG. 4 is a schematic diagram of an arrangement which is to be used for calibration of the measuring instrument.

The wattmeter is adjusted for proper operation by a simple self calibration procedure using a few external components as shown in FIG. 4, where same numerals for same elements as shown in FIG. 2 are used. The circuit is basically that of a current comparator capacitance bridge. The output current $I_S$ of the slave supply is compared, using the current comparator, to the current in a low-loss gas-dielectric reference capacitor 81. An inductive voltage divider 83 with a resistor $R_1$ and another inductive voltage divider 85 with a capacitor $C_1$, provide the means for balancing, respectively, the phase and magnitude errors of $I_S$. Multipliers 51 and 47 are used as phase sensitive detectors. The reference voltage is set at the in-phase voltage $E_0$ at the multiplier 51 (switch 52 in position 2). An adjustable external DC reference 56 is provided to the voltage-controlled amplifier 39 of the slave supply means by way of a switch 58 for calibration purposes.

The current-comparator-based wattmeter for high voltage power measurements at very low power factors which has been described can be used for load loss measurements of large power transformers, high voltage shunt reactors, and power capacitors. It has an estimated accuracy with respect to its readings of better than 3 percent at 0.001 power factor, 1 percent at 0.005 power factor and 0.5 percent at 0.01 power factor and higher.

I claim:

1. An electrical measuring instrument for performing high power measurements at very low power factors of a load connected to a high voltage source, comprising:

current comparator means having at least three windings, first ratio, second ratio and detection windings;

load current means, to be connected in series to the said load and the said high voltage source, for generating a load current signal indicative of the electrical load current flowing through the said load;

reference quadrature current means, to be connected directly to the said high voltage source, for generating a reference quadrature current signal indicative of the quadrature component of a reference load current flowing therethrough;

slave supply means connected to the said load current means and the said reference quadrature current means for generating a quadrature current signal in response to the said load current signal and the said reference quadrature current signal;

the first ratio winding of the said current comparator means to be connected in series with the said load;

the second ratio winding of the said current comparator means connected to the said slave supply means;

the said slave supply means being designed to produce the said quadrature current signal to balance the quadrature component of the said load current in the said current comparator means;

detector means connected to the detection winding of said current comparator means for detecting ampere-turn unbalance created therein;

quadrature ampere-turn balance means connected to the detector means for generating and applying a feedback signal to the said slave supply means; and multiplier means connected to the said detector means for generating a display signal indicative of one of high voltage power measurements.

2. The electrical-measuring instrument according to claim 1 wherein the said load current means comprises:

a load resistor connected in series with the said load and the first winding of the said current comparator means; and differential amplifier-converter means connected to the said load resistor for supplying the said load current signal to the said slave supply means.

3. The electrical measuring instrument according to claim 2 further comprising: current display means connected to the said differential amplifier-converter means to display the value of the load current.

4. The electrical measuring instrument according to claim 1 wherein the said reference quadrature current means comprises a voltage-to-current converter and is connected to the said high voltage source in parallel with the said load by way of a reference capacitor.

5. The electrical measuring instrument according to claim 4 wherein the said reference quadrature current means further comprises:

integrating means connected to the said voltage-to-current converter; and switch means to connect/disconnect the said integrating means.

6. The electrical measuring instrument according to claim 1 wherein the said slave supply means comprises a voltage controlled amplifier for generating the said quadrature current signal.

7. The electrical measuring instrument according to claim 6 wherein the said slave supply means further comprises:

divider means for generating a ratio signal indicative of the ratio of the said load current signal to the said quadrature current signal; and means for sending the said ratio signal to the said voltage controlled amplifier.

8. The electrical measuring instrument according to claim 1 wherein the said current comparator means includes a polarity switch.

9. The electrical measuring instrument according to claim 1 wherein the said multiplier means comprises:

first multiplier having a reference setting switchable to between a reduced replica and the in-phase component of the source voltage and connected to the said detector means for generating a signal indicative of the power for displaying.

10. The electrical measuring instrument according to claim 1 wherein the said quadrature ampere-turn balance means comprises:

second multiplier having a reference setting to the quadrature component of the source voltage and connected to the said detector means for generating a feedback signal to the said slave supply means and to a quadrature balance display.

11. The electrical measuring instrument according to claim 9 wherein the said quadrature ampere-turn balance means comprises:

second multiplier having a reference setting to the quadrature component of the source voltage and connected to the said detector means for generating a feedback signal to the said slave supply means and to a quadrature balance display.

12. The electrical measuring instrument according to claim 11 further comprising:

active voltage divider and converter means connected to the said reference quadrature current means for generating the said reduced replica, the said in-phase component and the said quadrature component of the source voltage to be applied to the said first and the said second multipliers.

13. The electrical measuring instrument according the claim 12 wherein the said active voltage divider and converter means comprises an integrator and an amplifier connected thereto.

14. The electrical measuring instrument according to claim 12 further comprising voltage display means connected to the said active voltage divider and converter means to convert the said reduced replica and display the source voltage.

15. The electrical measuring instrument according to claim 12 wherein the said active voltage divider and converter means comprises:

a phase-locked 60 Hz oscillator, and power factor display means for displaying the power factor of the load.

16. The electrical measuring instrument according to claim 1 further comprising current display means connected to the load current means for displaying the load current.

17. The electrical measuring instrument according to claim 6 further comprising an adjustable DC reference connected to the said slave supply means for calibration purposes.

18. The electrical measuring instrument according to claim 6 further comprising reactance display means connected to the said slave supply means for displaying the reactance value.

19. The electrical measuring instrument according to claim 1 further comprising a ratio extender means connected to the first winding of the said current comparator means.

* * * * *